(12) United States Patent
Cha

(10) Patent No.: US 11,290,029 B2
(45) Date of Patent: Mar. 29, 2022

(54) LEGGED ROBOT AND MANUFACTURING METHOD THEREOF

(71) Applicant: KOREA INSTITUTE OF SCIENCE AND TECHNOLOGY, Seoul (KR)

(72) Inventor: Youngsu Cha, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 210 days.

(21) Appl. No.: 16/711,641

(22) Filed: Dec. 12, 2019

(65) Prior Publication Data

US 2020/0403531 A1 Dec. 24, 2020

(30) Foreign Application Priority Data

Jun. 18, 2019 (KR) .......................... 10-2019-0072164

(51) Int. Cl.
*H02N 2/00* (2006.01)
*B25J 9/12* (2006.01)

(52) U.S. Cl.
CPC ............... *H02N 2/001* (2013.01); *B25J 9/12* (2013.01); *H02N 2/0055* (2013.01)

(58) Field of Classification Search
CPC .... H02N 2/001; H02N 2/0055; H01L 41/094; H01L 41/0926; B25J 9/12; B25J 9/0009; B62D 57/032
See application file for complete search history.

(56) References Cited

U.S. PATENT DOCUMENTS

| 9,242,370 | B2 | 1/2016 | Kong et al. |
| 2008/0277943 | A1* | 11/2008 | Donelan .................. F03G 5/00 290/1 R |
| 2015/0015120 | A1 | 1/2015 | Kaimori et al. |
| 2018/0034387 | A1 | 2/2018 | Arakawa et al. |
| 2019/0314980 | A1* | 10/2019 | Polygerinos .......... B25J 13/087 |

FOREIGN PATENT DOCUMENTS

| JP | 2013162050 A | 8/2013 |
| KR | 10-0811530 B1 | 3/2008 |
| KR | 10-1298088 B1 | 8/2013 |

OTHER PUBLICATIONS

Hirotaka Hida et al., "Simple millimeter-scale robot using Pb(Zr, Ti) piezoelectric thin film actuator on titanium substrate," Microsystem Technologies, 2016, vol. 22, pp. 1429-1436.
Kim Tien Nguyen et al., "Miniaturized Terrestrial Walking Robot Using PVDF/PVP/PSSA Based Ionic Polymer-Metal Composite Actuator," 2016, Journal of Mechanisms and Robotics, vol. 8, Issue. 4, No. 041006.
Yichuan Wu et al., "PRE-curved PVDF/PI unimorph structures for biomimic soft crawling actuators," 2018, IEEE Micro Electro Mechanical Systems, pp. 581-584.

* cited by examiner

*Primary Examiner* — Emily P Pham
(74) *Attorney, Agent, or Firm* — Rabin & Berdo, P.C.

(57) ABSTRACT

The present disclosure provides a biomimetic mobile legged robot, which includes a body formed to extend in one direction and having a piezoelectric element, and a leg connected to intersect the body and having a piezoelectric element. Here, a power is supplied to the body and the leg, respectively, and the piezoelectric elements of the body and the leg are operated with the supplied power to cause a full body motion so that the legged robot moves.

5 Claims, 21 Drawing Sheets

LEGGED ROBOT AND MANUFACTURING METHOD THEREOF

CROSS-REFERENCE TO RELATED APPLICATION

This application claims priority to Korean Patent Application No. 10-2019-0072164, filed on Jun. 18, 2019, and all the benefits accruing therefrom under 35 U.S.C. § 119, the contents of which in its entirety are herein incorporated by reference.

BACKGROUND

1. Field

The present disclosure relates to a legged robot and a legged robot manufacturing method.

2. Description of the Related Art

Legged robots have attracted attention for the last decade because of their ability to walk in man-made and wild areas. The legged robots may be used in a variety of environments, including hazardous situations, urban search and rescue operations.

Influenced by the movement of animals and insects, many researchers have proposed biomimetic legged robots, which have advantages in terms of stability and performance by finding and applying walking movements like animals. Most of the developed legged robots include a motor or a fluid actuator and may operate under robust external conditions with dynamic movement.

In addition to large legged robots, there is a considerable need for small robots that pass through a small area or hole using new materials such as electro-active materials.

The small robots are classified into (i) a robot having legs activated by a built-in actuator in which the legs directly generate movement motions and (ii) a robot having passive legs attached to an activated body in which the legs are passively moved due to activation of the body. The moving wave generated by the movement of the body generates movement. The robots use piezoelectric beam oscillation.

Meanwhile, in the development of small robots, a soft robot is known in the art. The soft robot has advantageous characteristics such as body deformation and shock absorption. These characteristics are essential and attractive for legged robots in unpredictable situations and environments.

As described above, there is a significant need for legged robots that may pass through a narrow passage, and a soft robot may provide a solution for this application.

SUMMARY

The present disclosure is designed to solve the above problems, and the present disclosure is directed to providing a legged robot, which may pass through an unpredictable situation or environment or a narrow passage.

In one aspect, there is provided a biomimetic mobile legged robot, comprising: a body formed to extend in one direction and having a piezoelectric element; and a leg connected to intersect the body and having a piezoelectric element, wherein a power is supplied to the body and the leg, respectively, and the piezoelectric elements of the body and the leg are operated with the supplied power to cause a full body motion so that the legged robot moves.

According to an embodiment of the present disclosure, the piezoelectric elements of the body and the leg may be PVDF films.

Preferably, the body may have a flat shape, and the leg may have a curved shape.

According to an embodiment of the present disclosure, the leg may include: a front leg disposed at a relatively front position along a moving direction of the legged robot; and a hind leg disposed at a relatively rear position along the moving direction of the legged robot, wherein the front leg and the hind leg may have different polarities.

The body may include: a first portion provided to an upper portion of the body; a second portion attached to the first portion and forming a lower portion of the body; and a conductive adhesive coated between the first and second portions so that the first and second portions are attached, wherein the first portion and the front leg may have the same polarity and the second portion and the hind leg may have the same polarity.

In another aspect of the present disclosure, there is also provided a legged robot manufacturing method, comprising: preparing a body by cutting a film into two predetermined rectangular shapes and attaching the two cut films using an adhesive; preparing a curved leg by cutting a film into a predetermined rectangular shape, disposing a copper tape on one surface of the cut film, and attaching an extension tape to the one surface; and attaching the leg to the body by coating an adhesive on the leg.

DETAILED DESCRIPTION

Hereinafter, the embodiments disclosed in this specification will be described in detail. Here, identical or similar components are denoted by identical or similar reference symbols and not described in detail again. In the following description, the word "unit" used in terms is selected or endowed only in consideration of ease naming and does not have any distinguishable meaning or role. In addition, in the following description of the embodiments of the present disclosure, any detailed description of related arts can be omitted if it is determined that the gist of the embodiments disclosed herein can be obscured by the same. Moreover, it should be understood that the accompanying drawings are just for better understanding of the embodiments disclosed herein and are not to be construed as limiting the scope of the present disclosure. The scope of the present disclosure should be understood as including all changes, equivalents and alternatives thereof.

Terms having an ordinal such as "first" and "second" can be used for explaining various components, but the components are not limited by the terms. These terms are just used for distinguishing any component from another.

In case it is mentioned that any component is "connected" to another component, the component may be connected directly to another component, but it should be understood that any other component can be further interposed between them.

The singular expressions are intended to include the plural forms as well, unless the context clearly indicates otherwise.

In this specification, the term such as "include" and "have" is just to specify the presence of features, integers, steps, operations, elements, parts or components thereof, stated in the specification, but does not preclude the presence or addition of one or more other features, integers, steps, operations, elements, parts or components thereof.

Referring to FIGS. 1 to 4C, the structure of a legged robot 100 according to the present disclosure will be described.

The legged robot 100 of the present disclosure is a biomimetic mobile legged robot 100 that includes a body 10 extending in one direction and a leg 20 connected to intersect the body 10.

The body 10 and the leg 20 have a piezoelectric element, respectively. Accordingly, a power is supplied to the body 10 and the leg 20, respectively, and the piezoelectric elements of the body 10 and the leg 20 are operated with the supplied power to cause a full body motion so that the legged robot 100 moves. The configuration in which the body 10 and the leg 20 have a piezoelectric element, respectively, will be described in more detail.

Figure 1A:
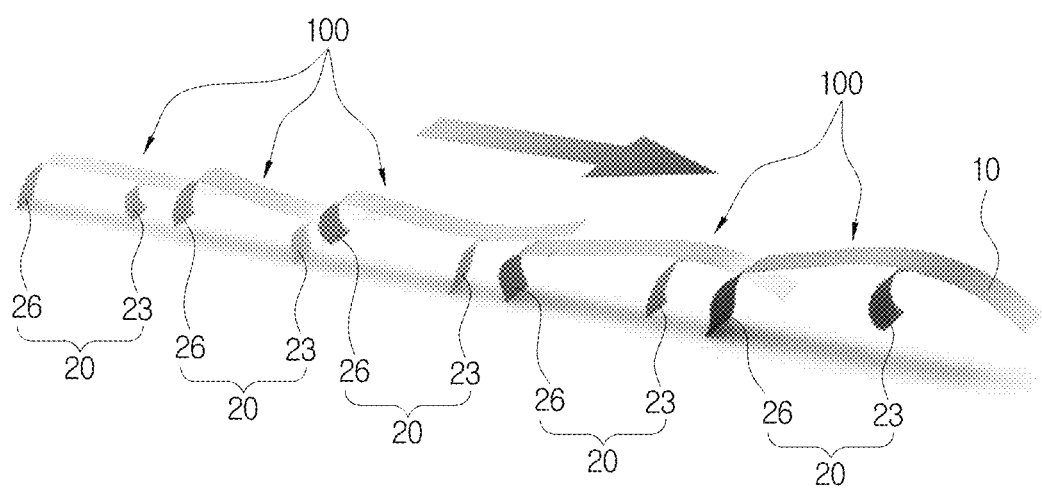
FIG. 1A is a perspective view showing an example where a legged robot of the present disclosure walks.
Figure 1B:
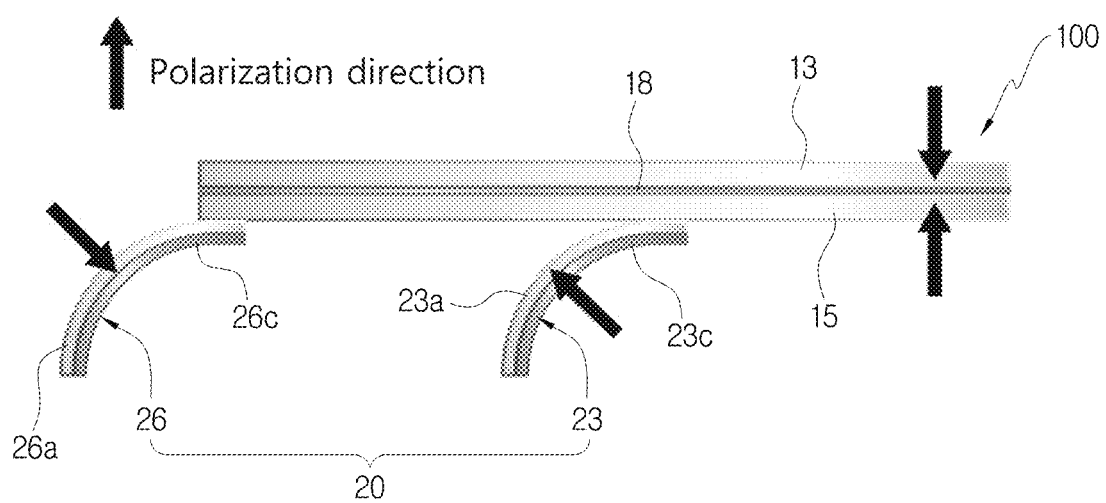
FIG. 1B is a sectioned view showing a structure and polarization direction of the legged robot according to the present disclosure.

As shown in FIGS. 1A and 1B, the body 10 may have a flat shape.

The body 10 may include a first portion 13, a second portion 15, and a conductive adhesive 18.

The first portion 13 is provided to an upper portion of the body 10. For example, the first portion 13 is a piezoelectric element, and the piezoelectric element may be, for example, a polyvinyliden fluoride (PVDF) film.

The second portion 15 is attached to the first portion 13 to form a lower portion of the body 10. Like the first portion 13, the second portion 15 is a piezoelectric element, and for example, the piezoelectric element may be a PVDF film.

In addition, the first and second portions 13, 15 may be both surfaces of a bimorph element, without being limited thereto.

The conductive adhesive 18 is coated between the first and second portions 13, 15 so that the first and second portions 13, 15 are attached to each other. In addition, the first and second portions 13, 15 are electrically connected to each other by the conductive adhesive 18 and have different polarities.

FIG. 1B shows an example where the first and second portions 13, 15 are coupled by the conductive adhesive 18. Seeing arrows indicating the polarization direction, the first portion 13 and the second portion 15 have opposite polarization directions.

As shown in FIGS. 1A and 1B, the leg 20 may have a curved (pre-curved) shape. In addition, the leg 20 may include a front leg 23 and a hind leg 26. Here, the front leg 23 is disposed at a relatively front position along a moving direction of the legged robot 100, and the hind leg 26 is disposed at a relatively rear position along the moving direction of the legged robot 100.

In addition, the front leg 23 is disposed near the center of the body 10, and the hind leg 26 is disposed at a rear end of the body 10, without being necessarily limited to this structure.

Meanwhile, the front leg 23 and the hind leg 26 may have different polarities. In addition, the front leg 23 and the hind leg 26 may have the same structure, except that they have different polarities.

The front leg 23 may include a piezoelectric portion 23a, a copper tape 23b, and an extension tape 23c. In addition, the hind leg 26 has substantially the same structure as the front leg 23 and may include a piezoelectric portion 26a, a copper tape 23b, and an extension tape 26c.

The piezoelectric portions 23a, 26a are piezoelectric elements and may be, for example, PVDF films.

The copper tapes 23b, 26b are electrically connected to supply wires and function as electrodes that transfer an external power to the piezoelectric portions 23a, 26a.

The extension tapes 23c, 26c may be, for example, kaptone tapes or polyimid tapes, which are stretched and attached to the piezoelectric portions 23a, 26a. The piezoelectric portions 23a, 26a are attached to the extension tapes 23c, 26c, thereby maintaining the curved structure.

For example, one end of the copper tape 23b is attached between the piezoelectric portions 23a, 26a and the extension tapes 23c, 26c, and the copper tape 23b is disposed on the piezoelectric portions 23a, 26a in a folded state.

In the front leg 23 and the hind leg 26, the electrodes of the copper tape 23b, 26b have opposite polarities. As shown in FIG. 1B, the polarization directions of the front leg 23 and the hind leg 26 are opposite to each other. Thus, the front leg 23 and the hind leg 26 operate in opposite directions, so that the legged robot 100 is capable of moving like the front and hind legs 23, 26 of a quadruped vertebrate.

The configurations of the front leg 23 and the hind leg 26 are identical except that the polarities of the electrodes of the copper tapes 23b, 26b are opposite.

In other words, the legged robot 100 of the present disclosure may implement a biomimetic mobile robot using a flexible piezoelectric actuator since the first and second portions 13, 15 of the body 10 and the piezoelectric portions 23a, 26a of the leg 20 are made of a flexible piezoelectric element, for example a PVDF film.

The legged robot 100 of the present disclosure may be a soft legged mobile robot having the body 10 of a bimorph piezoelectric element type and the curved piezoelectric leg 20.

In the legged robot 100 of the present disclosure, the body 10 and the leg 20 may have high flexibility and be operated by an electrical input.

In the present disclosure, the body 10 may have a length of 50 mm and a width of 10 mm, and the leg 20 may have a length of 20 mm and a width of 10 mm, without being necessarily limited to these numerals.

The legged robot 100 of the present disclosure may be made of a soft material and have high adaptation flexibility due to its structure having the leg 20.

The legged robot 100 of the present disclosure operates like quadruped vertebrates, since the body 10 moves and the front and hind legs 20 also make relative movements.

Figure 5:
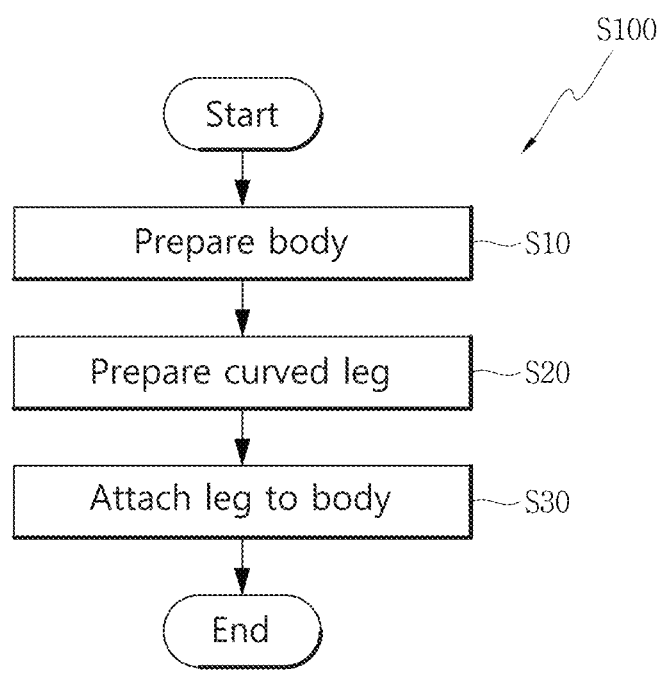
FIG. 5 is a flowchart for illustrating a legged robot method of the present disclosure.

Meanwhile, referring to the flowchart of FIG. 5, a manufacturing method (S100) of the legged robot 100 of the present disclosure includes preparing a body 10 (S10), preparing a curved leg 20 (S20), and attaching the leg 20 to the body 10 (S30).

In the step (S10) of preparing the body 10, a film is cut into two predetermined rectangular shapes, and the two cut films are attached using a conductive adhesive 18. The conductive adhesive 18 is preferably a conductive epoxy.

Figure 2A:
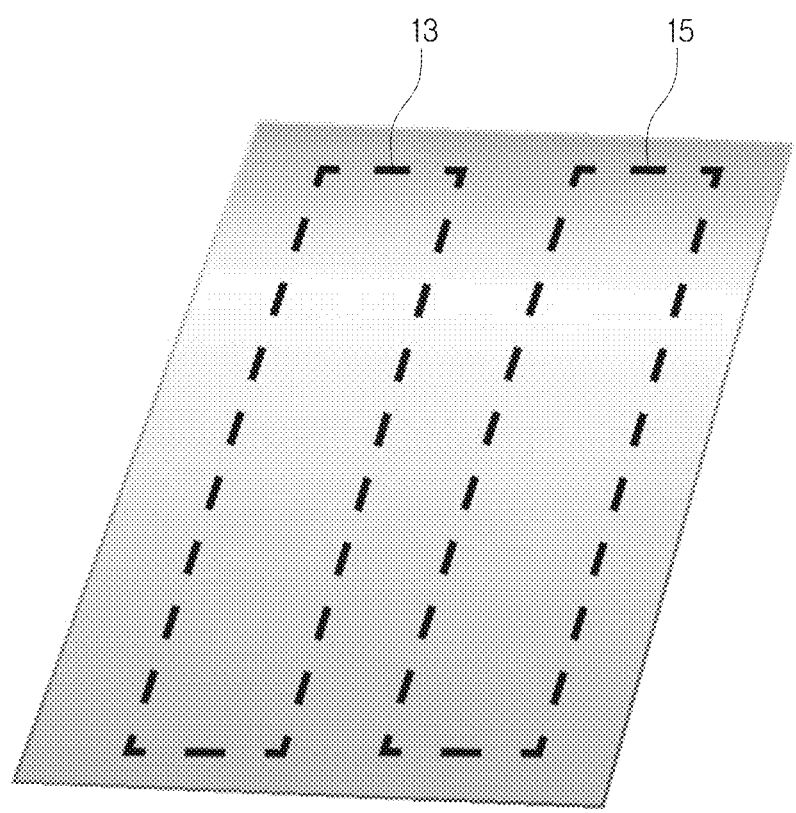
FIG. 2A is a perspective view showing that first and second portions of a body of the present disclosure are cut.
Figure 2B:
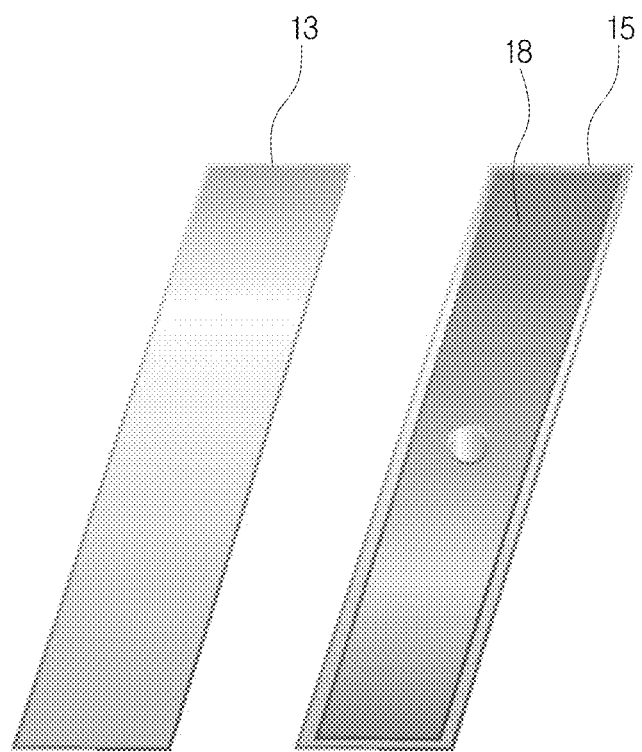
FIG. 2B is a perspective view showing an example of a conductive epoxy coated on the cut second portion of FIG. 2A.
Figure 2C:
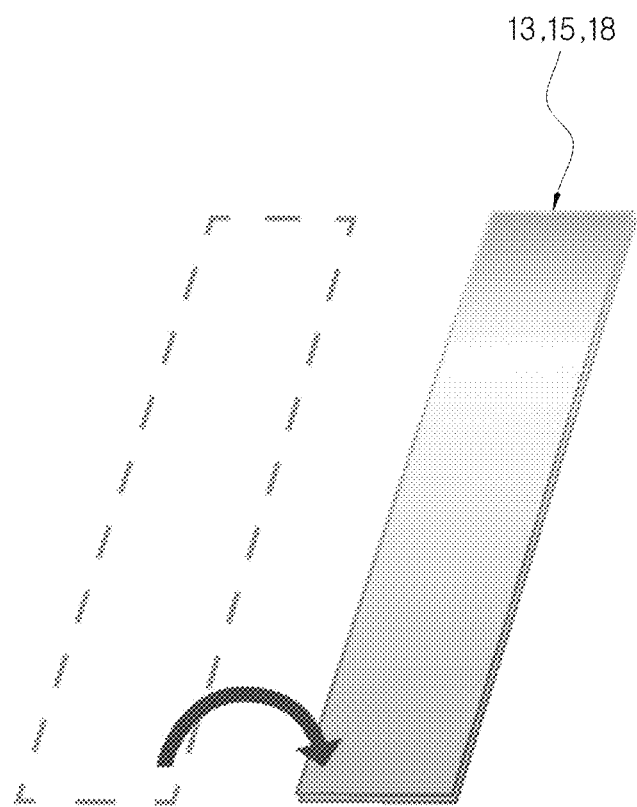
FIG. 2C is a perspective view showing that the first and second portions are attached to each other by a conductive epoxy.

Referring to FIGS. 2A to 2C, an example of the step (S10) of preparing the body 10 will be described.

A PVDF film having a thickness of 110 µm may be cut into two predetermined rectangular shapes. In addition, a conductive epoxy is injected into a small portion of the film, and the epoxy is spread over the remaining area of the film so that the two films are electrically connected. The first and second portions 13, 15 are arranged sequentially to have opposite polarization directions. The first and second portions 13, 15 are maintained for 24 hours at 20° C. so that the epoxy between the films is hardened.

In the step S20 of preparing the curved leg 20, a film is cut into a predetermined rectangular shape, a copper tape 23b is disposed on one surface of the cut film, and an extension tape 23c, 26c is attached to the one surface.

Figure 3A:
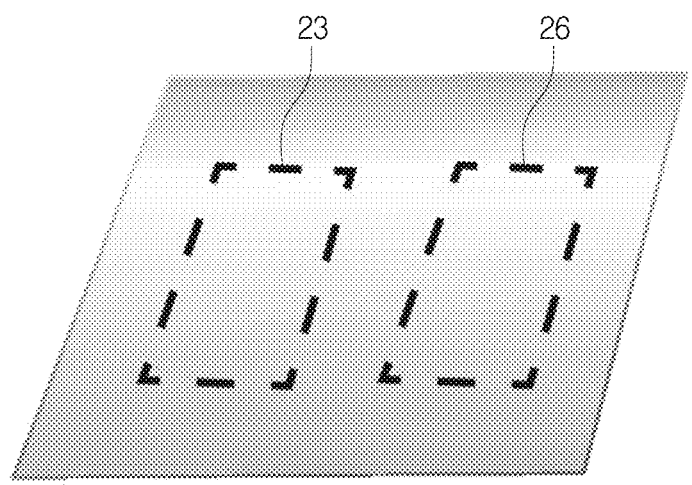
FIG. 3A is a perspective view showing that a piezoelectric portion of a leg of the present disclosure is cut.
Figure 3B:
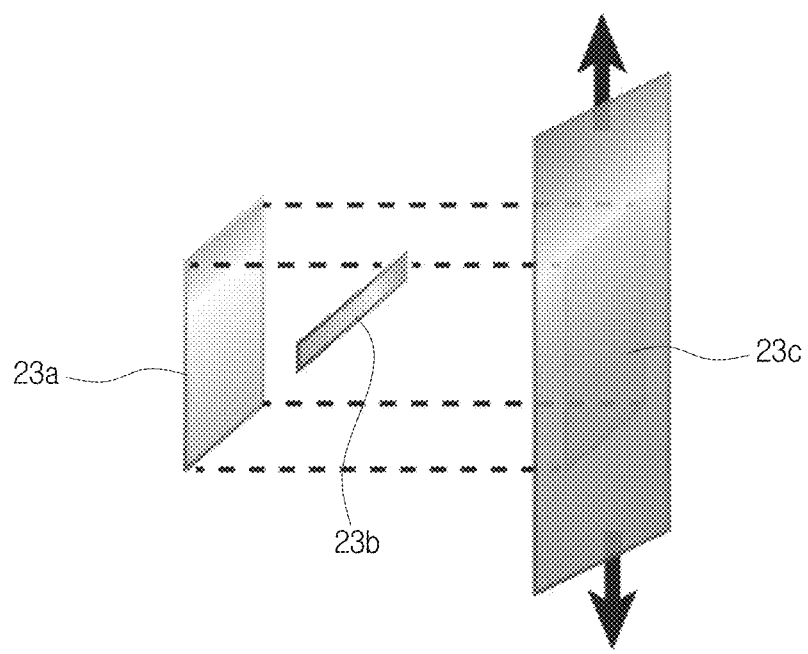
FIG. 3B is a perspective view showing an example where the piezoelectric portion of FIG. 3A and a copper tape are attached to an extension tape.
Figure 3C:
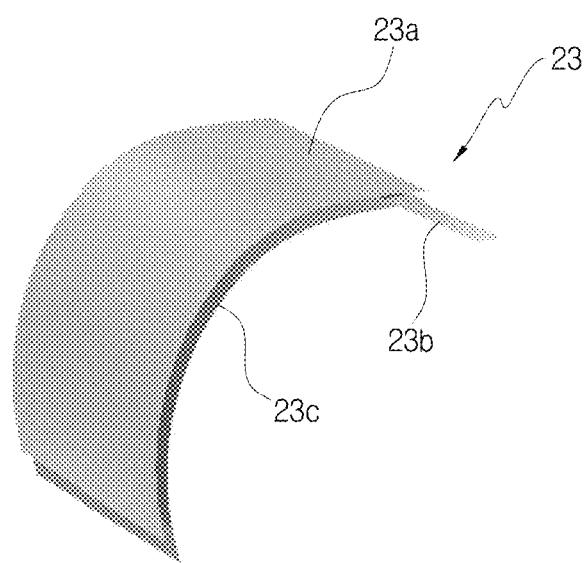
FIG. 3C is a perspective view showing an example where a curved leg is prepared by cutting the extension tape.

Referring to FIGS. 3A to 3C, an example of the step (S20) of preparing the curved leg 20 will be described.

The curved leg 20 may be made with a curved unimorph actuator using a PVDF film having a thickness of 28 µm. A polyimide tape with a strain of 0.01 is stretched to make a curved structure, and then the PVDF film is attached to the stretched tape. The curvature of curved leg 20 may be about 115 m$^{-1}$.

The leg 20 may maintain the curved shape by the extension tape 23c, 26c, and the copper tape 23b functions as an electrode capable of supplying a power to the curved piezoelectric portion 23a, 26a.

In the step (S30) of attaching the leg 20 to the body 10, an adhesive is coated on the leg 20, and the leg 20 coated with the adhesive is attached to the body 10.

Figure 4A:
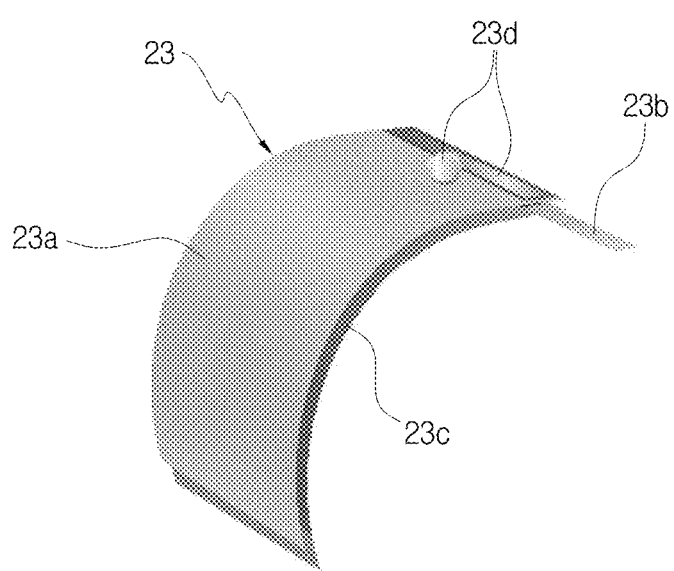
FIG. 4A is a perspective view showing an example where the conductive epoxy is coated on an upper portion of the leg.
Figure 4B:
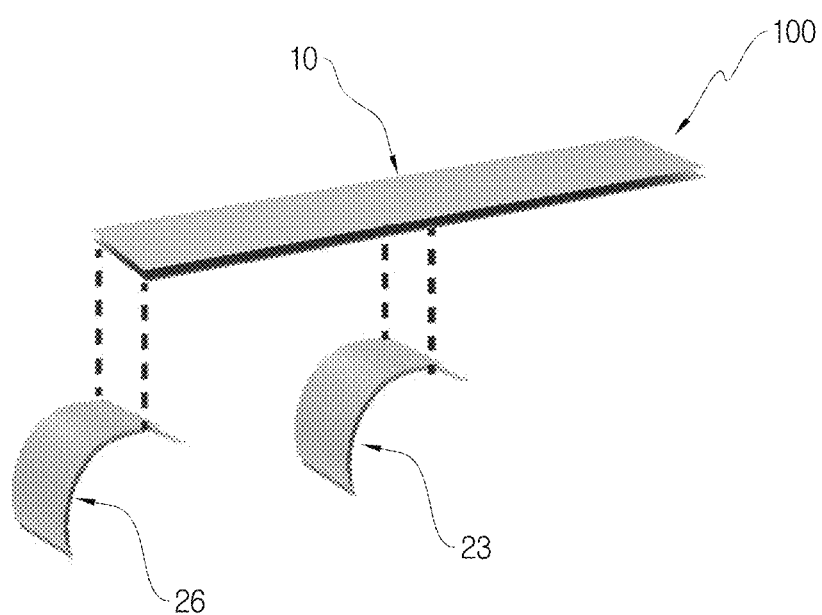
FIG. 4B is a perspective view showing an example where the leg is attached to the body.
Figure 4C:
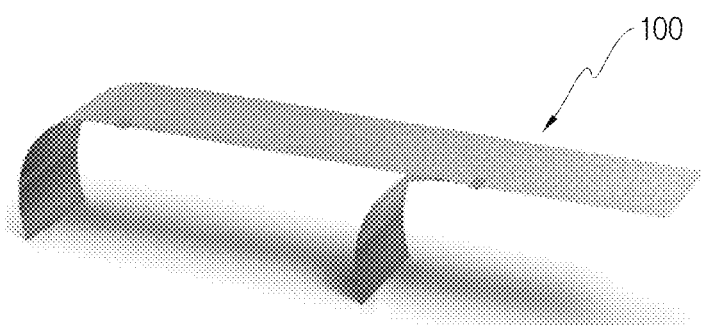
FIG. 4C is a perspective view showing an example of a legged robot completely manufactured by attaching the leg to the body.

Referring to FIGS. 4A to 4C, an example of the step (S30) of attaching the leg 20 to the body 10 will be described.

The leg 20 is attached to the body 10. The positions of the front leg 23 and the hind leg 26 may be 15 mm and 46 mm from a head position of the robot, respectively. To electrically connect the leg 20 to the body 10, a folded conductive copper tape 23b is placed on a bottom of the leg 20 and a top of the body 10, and a conductive epoxy is coated between a top of the leg 20 and a bottom of the body 10. The front leg 23 and the hind leg 26 are attached to the body 10 with opposite polarities.

The first portion 13 of the body 10 and the hind leg 26 have the same polarity, and the second portion 15 of the body 10 and the front leg 23 have the same polarity.

In general, a quadruped vertebrate uses its body 10 and leg 20 to move forward. Specifically, the front leg 23 and the hind leg 26 of the quadruped vertebrate move in opposite directions. If the hind foot kicks the ground, the hind leg 26 is stretched and the front leg 23 is pulled to prepare for kicking the ground.

The legged robot 100 of the present disclosure is motivated by the movement of quadruped vertebrates. The legged robot 100 may be formed as a soft robot, and in the present disclosure, the legged robot 100 has a very light weight of 0.32 g.

Figure 6:
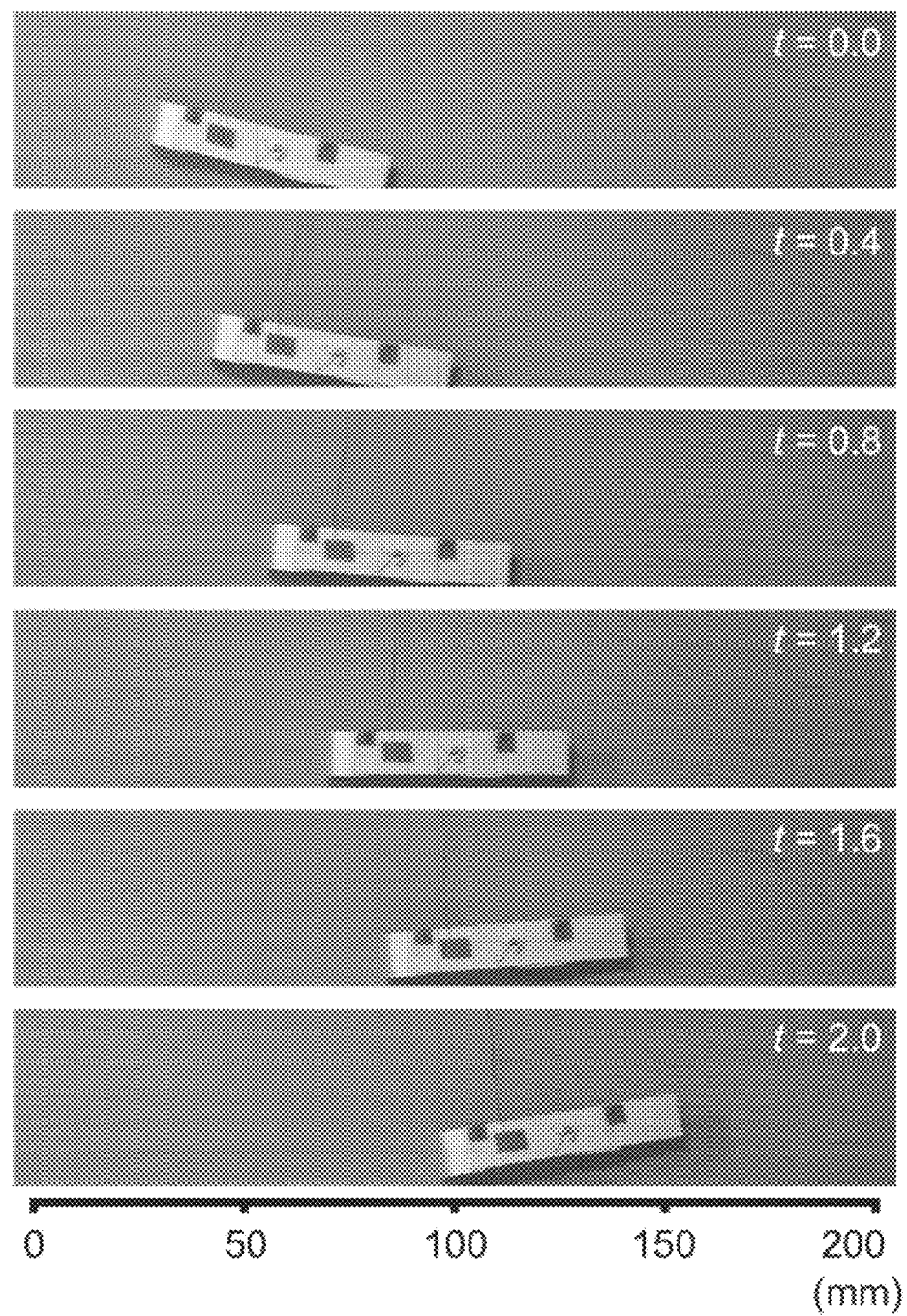
FIG. 6 is a photograph showing that the legged robot of the present disclosure moves over time.
Figure 12:
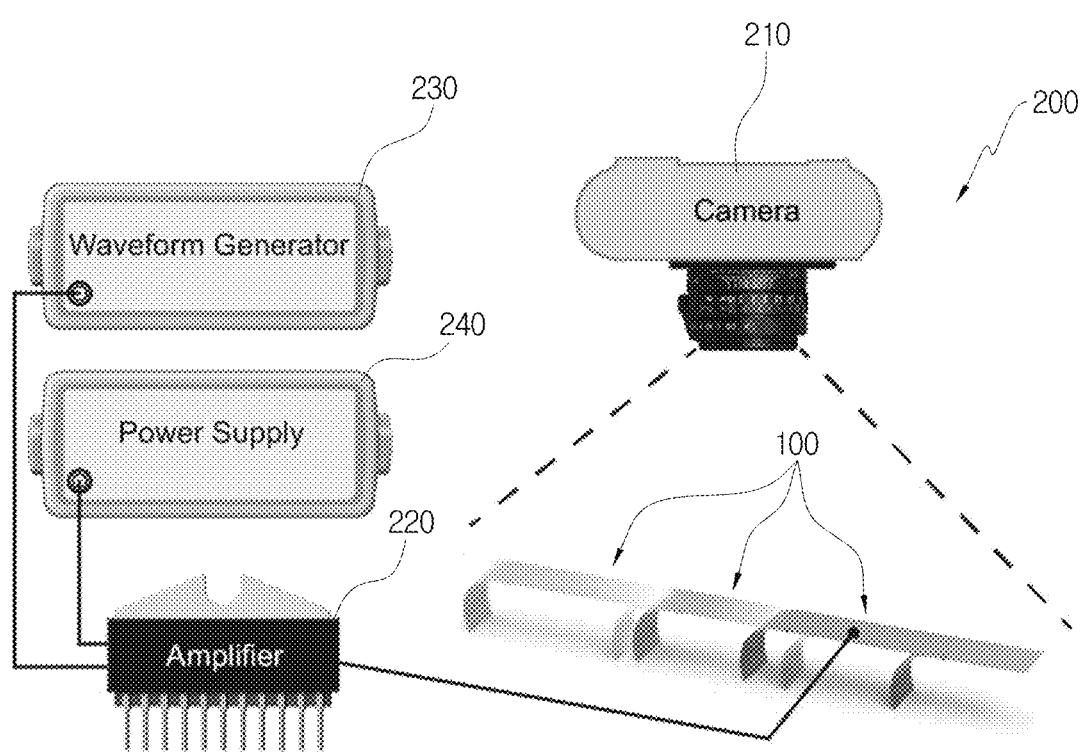
FIG. 12 is a diagram showing an experiment device for measuring a movement of the legged robot according to the present disclosure.

The movement of the legged robot 100 is shown in FIG. 6. Here, a square wave voltage signal is applied to the legged robot 100, and the intensity of the applied voltage is 130V as a peak-peak value (DC 65V, AC±65V). In the experiment of the present disclosure, an optimum frequency for the movement of the legged robot 100 is derived, which can be from 1 Hz to 200 Hz. Here, the legged robot 100 may have the fastest speed at the optimal frequency of 160 Hz. FIG. 6 shows the displacement of the legged robot 100, where two legs 20 move in 2 seconds. In FIG. 6, the legged robot 100 moves 70 mm from left to right. The movement of the legged robot 100 is not a straight line due to the tension of the wire of the power supply 240 (FIG. 12). The movement of the robot may be influenced by a connecting wire. To measure the displacement of the legged robot 100, the experiment is performed 10 times. The average displacement and speed of the robot are obtained from the experimental results. In connection with the experiment, a more detailed description will be provided later.

Figure 7A:
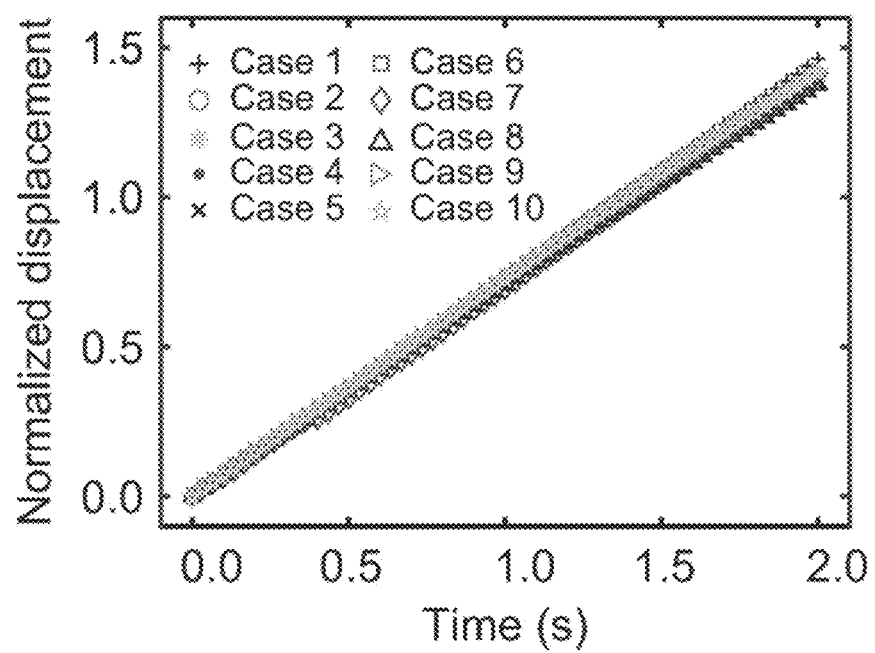
FIG. 7A is a graph showing a normalized displacement of the legged robot.

FIG. 7A shows the displacement of the legged robot 100 in a lateral direction for 10 times. The displacement is normalized by the length L of the body 10. In all cases, the normalized displacement value increases over time, with a slight difference. The time taken for the legged robot 100 to move by the length of the body 10 is approximately 1.4 s.

Figure 7B:
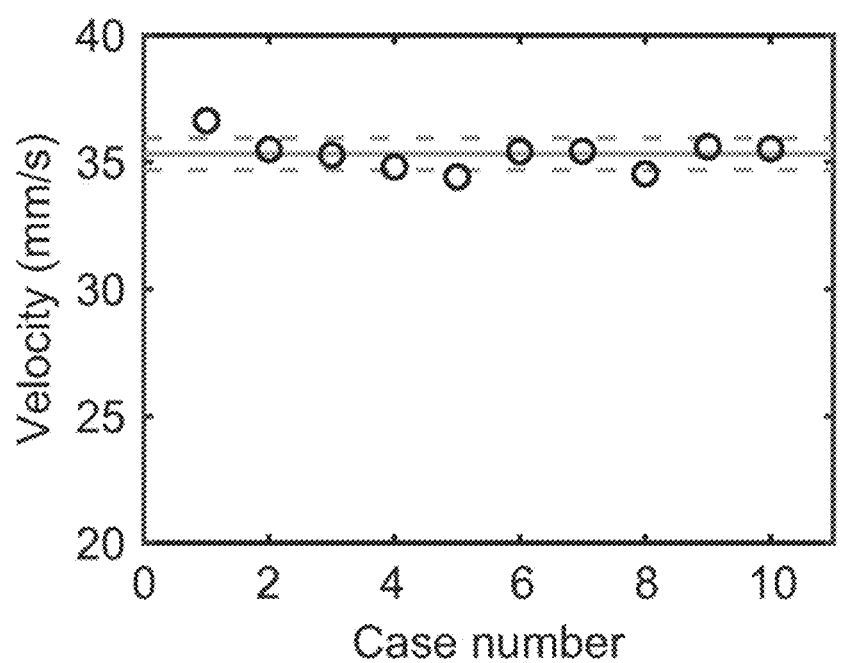
FIG. 7B is a graph showing a speed of the legged robot.

The speed data from the experience of the legged robot 100 is shown in FIG. 7B. Here, a circle on the graph shows the speed in each case, a solid line shows an average speed for 10 times, and a dotted line shows a standard deviation. The average speed of the legged robot 100 for 10 times is 35.3 mm/s. The speed derived from the experiment shows that the legged robot 100 of the present disclosure is able to move 70% of the length of the body 10 per second.

Through the experiments, the moving displacement and speed of the legged robot 100 of the present disclosure may be found.

In addition, a physical mechanism of the legged robot 100 is investigated using a numerical simulation. The legged robot 100 generates walking movements like animals.

The leg 20 has different stride lengths due to different active conditions of the leg 20 of the legged robot 100, which affects the performance of the legged robot 100. In addition, the legged robot 100 may maintain its movement even under a sudden impact.

To investigate the effects of the front leg 23 and the hind leg 26, experiments are conducted under four different leg conditions. The four different leg conditions include a condition in which both legs are activated, a condition in which only the front leg is activated, a condition in which only the hind leg is activated, and a condition in which both legs 20 are inactivated. For all leg conditions, the body is always active. The leg 20 may be inactivated by removing the copper tape 23b that electrically connects the body and the leg.

In each case, 10 experiments are repeated to calculate an average velocity and a standard deviation.

Figure 8:
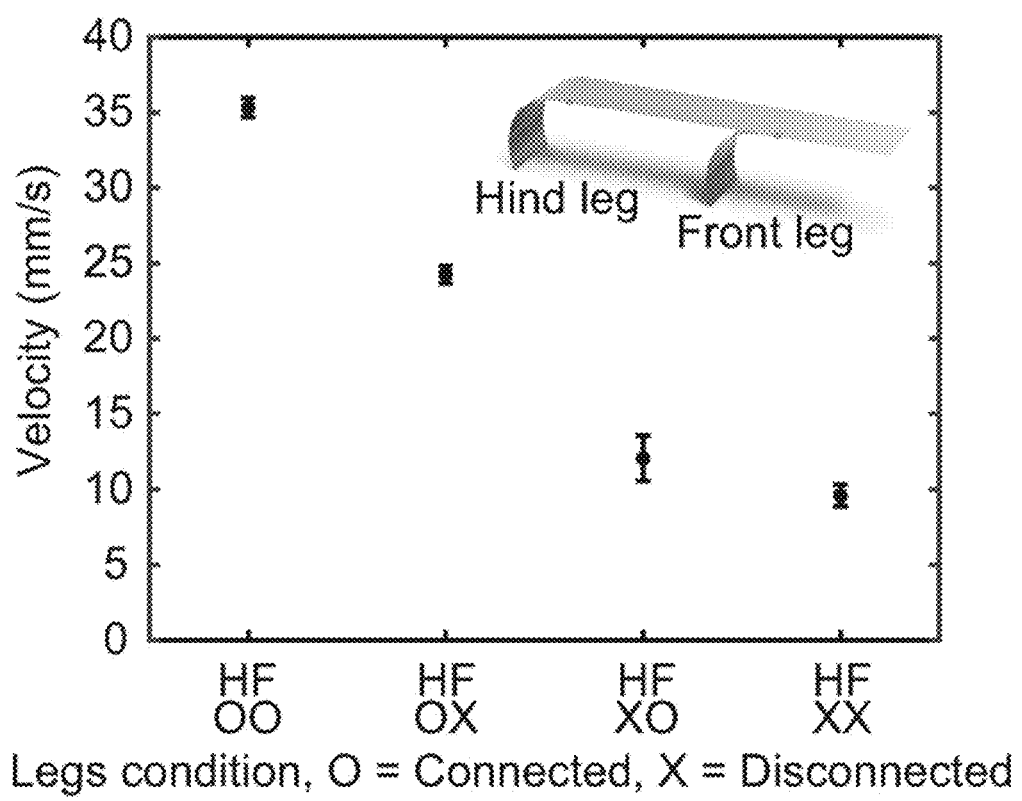
FIG. 8 is a graph showing a speed under four different leg conditions.

FIG. 8 shows the speed in four different leg conditions. Compared to the other leg conditions, the superior speed performance is found in FIG. 8 when both legs are activated. When both legs are activated, the speed of the legged robot 100 is increased by about 3.7 times compared to when both legs are inactive.

When both legs 20 do not work, in FIG. 8, a significant slowdown is found. When the hind leg 26 (represented by H) is inactivated, the speed drop is considerably greater than when the front leg 23 (represented by F) is inactivated (X=Disconnected). When the front leg 23 is inactivated, the speed drop is 69.8% compared to when both legs 20 are activated (O=Connected). Meanwhile, when the hind leg 26 is electrically inactivated, the speed drop is 34.3% compared to when both legs 20 are activated.

Regarding the physical mechanism of the legged robot 100, under different conditions of the leg 20, the legged robot 100 shows some notable trends. However, since the legged robot 100 is operated by microscopic displacement of the piezoelectric actuator, it is difficult to understand the physical mechanism only from optical measurement.

Figure 9:
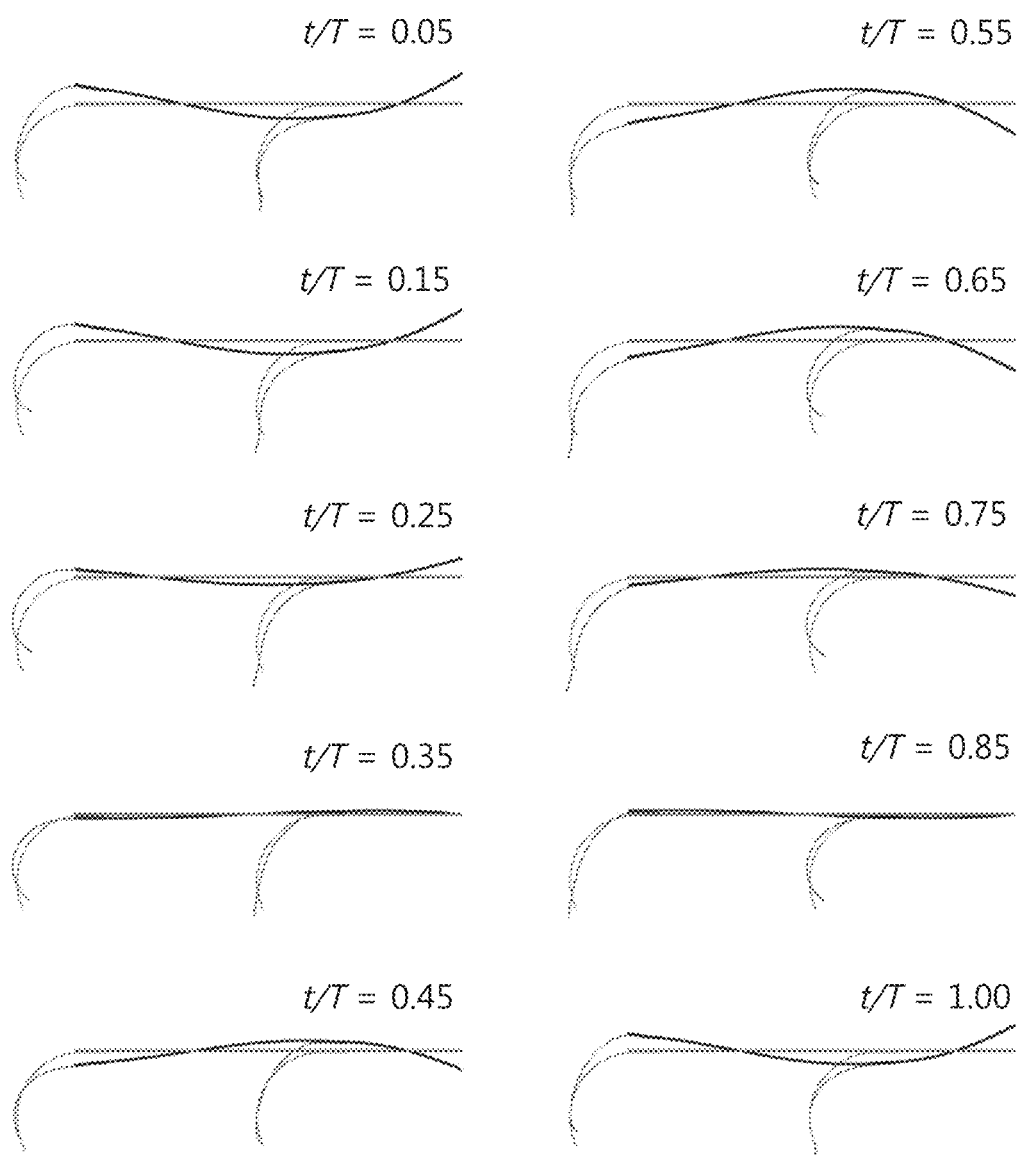
FIG. 9 is a perspective view showing a motion of the legged robot when all legs are activated.

When all legs 20 are activated, the movement of the legged robot 100 in time sequence is shown in FIG. 9. Time (t) is divided by the period of the input operation signal T and normalized.

When the normalized time (t/T) is 0.05, the body 10 has a U shape and the front leg 23 is located below the hind leg 26. When the normalized time increases to 0.35, the front leg 23 moves upward and the hind leg 26 moves downward.

At the same time, the front leg 23 is extended and generates an action like kicking the ground. Unlike the front leg 23, the hind leg 26 is flexible and generates an action moving away from the ground. It should be noted that when both legs 20 are activated, the front leg 23 and the hind leg 26 operate reversely. After the t/T value is 0.35, the structure of the body 10 begins to change from the U shape to an opposite shape. Here, the front leg 23 moves upward and the hind leg 26 moves downward.

At the same time, the hind leg 26 extends and a tip of the hind leg 26 (looking like a foot) moves downward. Meanwhile, the front leg 23 is shrunk. If the hind leg 26 is activated and the front leg 23 is inactivated, the movement of the front leg 23 is significantly reduced.

The movements of the body 10 and the leg 20 of the legged robot 100 are like a running animal. When a quadruped vertebrate runs, the footfall of the hind leg 26 is followed by the front leg 23 kicking the ground. Further, most quadruped vertebrates use their spine and leg 20 to achieve significant speeds. As shown in FIG. 9, the legged robot 100 of the present disclosure may move using the body 10 and the leg 20.

Figure 10A:
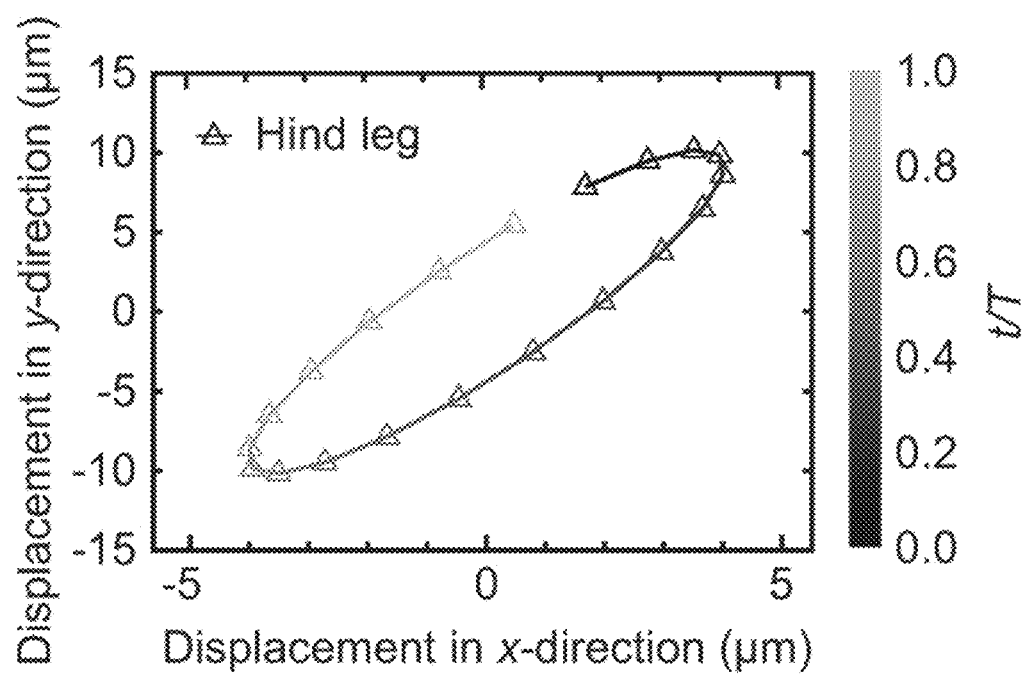
FIG. 10A is a graph showing an x-directional displacement of a hind leg.
Figure 10B:
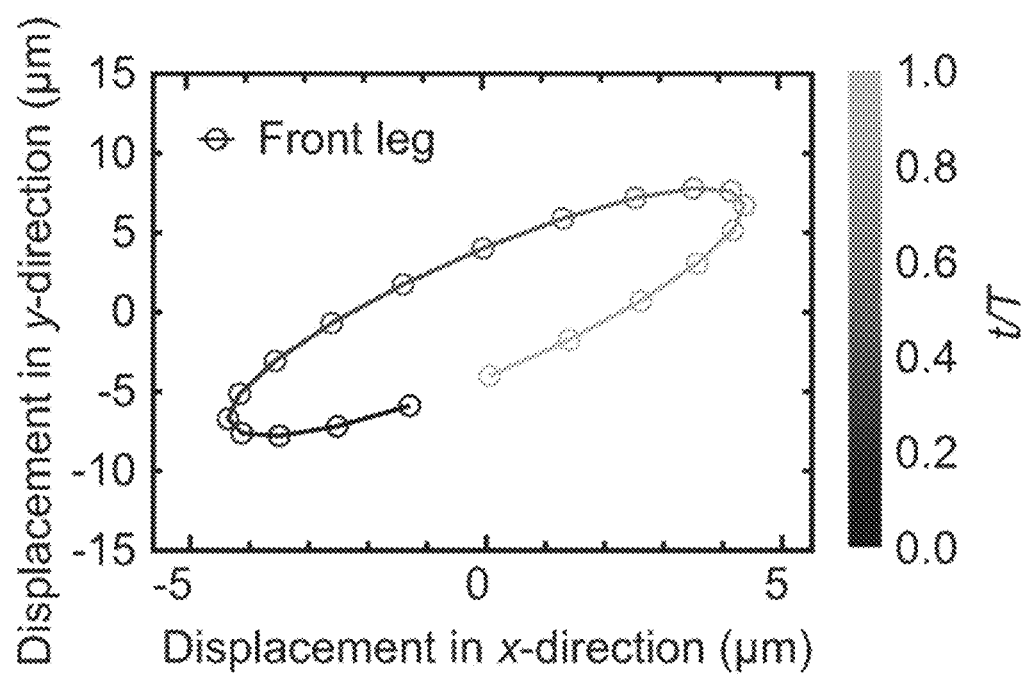
FIG. 10B is a graph showing an x-directional displacement of a front leg.

Specifically, to monitor the movement of the leg 20, as shown in FIGS. 10A and 10B, the displacement of the tip of the leg 20 is tracked in the horizontal (x) and vertical (y) directions during one stride. Both legs 20 move along an ellipse in the clockwise direction. Meanwhile, the direction of movement in the hind leg 26 and the front leg 23 are significantly different. The hind leg 26 is located at an upper right side in the graph of FIG. 10A, while the front leg 23 starts moving at a lower left corner in the graph of FIG. 10B. Specifically, the hind leg 26 moves obliquely downward and the front leg 23 moves obliquely upward. This is due to the action of the hind leg 26 kicking the ground when the front leg 23 leaves the ground.

When the legged robot 100 has the leg 20 inactivated, the lateral displacement of the inactivated leg 20 decreases by 49% compared to the activated leg 20. The reduction in the lateral displacement of the leg 20 affects the performance of the legged robot 100. Compared to a robot in which no leg 20 is activated, the sum of displacements of the front leg 23 and the hind leg 26 is about 200% larger. This trend is consistent with experimental speed results.

Figure 11:
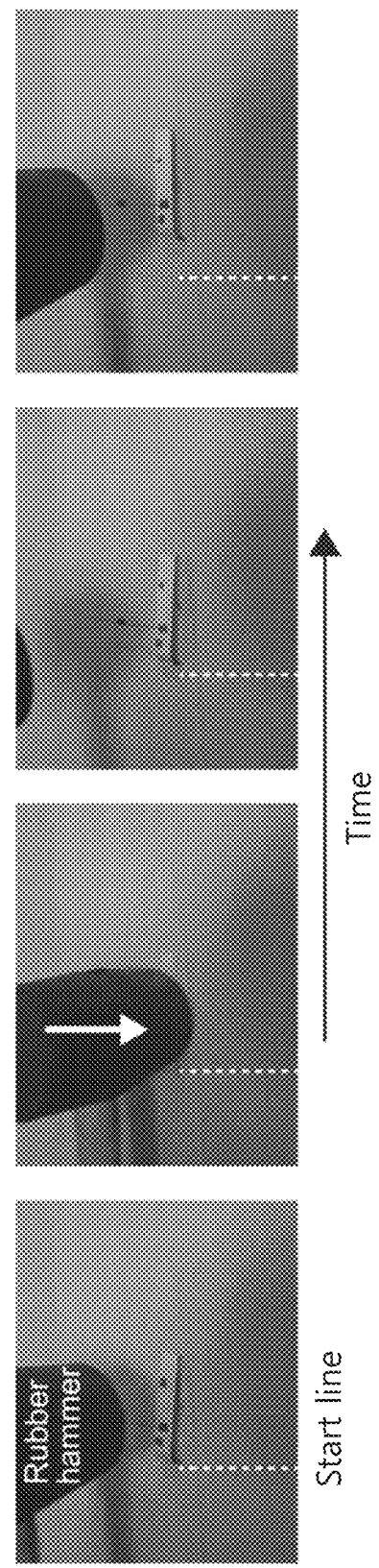
FIG. 11 is a photograph showing an example where a shocked legged robot moves.

The legged robot 100 of the present disclosure may be used when traveling in unknown environments where sudden external shocks such as sudden rock falling may occur. As shown in FIG. 11, a rubber mallet may be used to give an impact to the legged robot 100. Here, since the legged robot 100 of the present disclosure has a great deal of flexibility, the legged robot 100 may continuously move after the impact. Despite repeated impacts, the robot returns to its original shape and continues to operate.

The legged robot 100 of the present disclosure has significant mobility and elastic resilience. The performance of the robot may be improved by the curved leg 20 prepared by stretching the PVDF film sheet and the polyimide tape.

Also, the legged robot 100 may vary in mobility depending on which leg 20 is operating or activated.

Hereinafter, an experiment performed using an experiment device 200 of the legged robot 100 according to the present disclosure will be described.

DC 65V and AC±65V are applied to the legged robot 100, and an amplifier 220 (PA95, Apex Microtechnology Co., Ltd.) and an evaluation kit (EVAL 23, REVB, Apex Microtechnology Co., Ltd.) are used. The amplification value is 100. FIG. 12 shows an example in which the experimental device includes a camera 210, an amplifier 220, a power supply 240, and a waveform generator 230.

The power supply 240 is connected to the amplifier 220 to provide an operating voltage, which may be DC 180V. The power supply 240 is, for example, MK-1000CK and may be MK POWER.

The waveform generator 230 provides a control signal to the amplifier 220.

In addition, the body 10 of the legged robot 100 may be connected to the amplifier 220 using a wire. In addition, a PVC plate may be used as a boundary ground. Meanwhile, a camera may be used to record optical data. For example, the camera is installed to an upper portion of the legged robot 100 to capture images of the legged robot 100 at a rate of 120 frames per second. In addition, the speed of the legged robot 100 is analyzed using the obtained optical data, and a tracking maker of the legged robot 100 is tracked using a color tracking code.

The legged robot of the present disclosure may be used when traveling in unknown environments where sudden external shocks such as sudden rock falling may occur.

Also, the legged robot of the present disclosure has a lot of flexibility, so the legged robot may keep moving after an impact. Despite repeated impacts, the robot returns to its original shape and continues to operate.

In addition, the legged robot of the present disclosure may implement a biomimetic mobile robot using a flexible piezoelectric actuator, since the first and second portions of the body and the piezoelectric portion of the leg include a flexible piezoelectric element, for example a PVDF film.

The legged robot 100 and the legged robot manufacturing method (S100) as described above is not limited to the configuration and method of the embodiments described above, but the embodiments may be modified in various ways by combining the embodiments entirely or selectively.

It will be apparent to those skilled in the art that the present disclosure can be embodied in other specific forms without departing from the essential characteristics of the present disclosure. Accordingly, the above detailed description should be considered in all respects as illustrative and not restrictive. The scope of the present disclosure shall be determined by rational interpretation of the appended claims, and all changes within the equivalence scope of the present disclosure shall fall within the scope of the present disclosure.

What is claimed is:

1. A biomimetic mobile legged robot, comprising:
a body formed to extend in one direction and having a piezoelectric element; and
a leg connected to intersect the body and having a piezoelectric element,
wherein a power is supplied to the body and the leg, respectively, and the piezoelectric elements of the body and the leg are operated with the supplied power to cause a full body motion so that the biomimetic mobile legged robot moves.

2. The biomimetic mobile legged robot according to claim 1, wherein the piezoelectric elements of the body and the leg are PVDF films.

3. The biomimetic mobile legged robot according to claim 1, wherein the body has a flat shape, and the leg has a curved shape.

4. The biomimetic mobile legged robot according to claim 1, wherein the leg includes: a front leg disposed at a relatively front position along a moving direction of the biomimetic mobile legged robot, and a hind leg disposed at a relatively rear position along the moving direction of the biomimetic mobile legged robot, wherein the front leg and the hind leg have different polarities.

5. The biomimetic mobile legged robot according to claim 4, wherein the body includes: a first portion provided to an upper portion of the body; a second portion attached to the first portion and forming a lower portion of the body; and a conductive adhesive coated between the first and second portions so that the first and second portions are attached, wherein the first portion and the front leg have the same polarity, and the second portion and the hind leg have the same polarity.

* * * * *